United States Patent

Takashi et al.

Patent Number: 5,858,576
Date of Patent: Jan. 12, 1999

[54] STENCIL MASK FOR PHOTOCHEMICAL REACTION PROCESS AND METHOD OF MAKING THE SAME

[75] Inventors: Goto Takashi, Ushiku; Ogura Masayoshi; Terakado Shingo, both of Tsukuba, all of Japan

[73] Assignee: Sanyo Electric Co., Ltd., Osaka, Japan

[21] Appl. No.: 327,302

[22] Filed: Oct. 21, 1994

[30] Foreign Application Priority Data

Oct. 22, 1993 [JP] Japan .................................. 5-264948

[51] Int. Cl.$^6$ ............................................... G03F 7/00
[52] U.S. Cl. .................... 430/5; 378/34; 378/35
[58] Field of Search .................. 430/5; 378/34, 378/35

[56] References Cited

U.S. PATENT DOCUMENTS

| | | | |
|---|---|---|---|
| 4,080,267 | 3/1978 | Castellani | 204/15 |
| 5,464,711 | 11/1995 | Mogab | 430/5 |

OTHER PUBLICATIONS

*Semicon News*, Oct. 1988, pp. 31–38. (English abstract in Supplemental IDS).
*Hyomen Kagaku*, vol. 5, No. 4, Masataka Hirose, Plasma & Photo–Excited Processes, 1984, pp. 435–444. (English abstract in Supplemental IDS).
*Semiconductor World*, Technical Report, Dec. 1989, pp. 110–113. (English abstract in Supplemental IDS).
*American Vacuum Society*, Atoda et al., Diffraction Effects on Pattern Replication with Synchrotron Radiation, Oct. – Dec. 1983, pp. 1267–1270.
Fujiwara, Nobuo, et al. "Cold and Low–Energy Ion Etching (Collie)", Proc. of 1989 Intern. Symp. On MicrolProcess Conference pp. 239–242.
Madouri, A., et al., "Non Hydrogenated Materials For X–Ray Masks ($Si_3N_4$ And SiC)", Microelectronic Engineering 7 (1987) 241–245, North–Holland.
Visser, C.C.G., "A New Silicon Nitride Mask Technology For Synchrotron Radiation X–Ray Lithography: First Results", Microelectronic Enginnering 6 (1987) 299–304, North–Holland.
Ohki, Shigehisa, et al., "High–Precision X–Ray Mask Technology", NTT LSI Laboratories, pp. 68–72.

*Primary Examiner*—Kathleen Duda
*Attorney, Agent, or Firm*—Loeb & Loeb LLP

[57] ABSTRACT

A stencil mask for use in a photochemical reaction process, comprising a mask substrate 1, an absorber film 3 which is formed on one surface of the mask substrate 1, has a window 2, and not only absorbs or reflect photons but is also self-supportive, and a pattern 5 depicted on the absorber film 3. The self-supportive function of the absorber film 3 dispenses with the presence of a film for supporting itself. This simplifies the structure of the stencil mask, and reduces the number of stencil mask manufacturing steps. The quality of the pattern 5 can be improved since the sides of the absorber film 3 carrying the pattern 5 are not covered by any film. The absorber film 3 is made of gold Au or tungsten W.

The pattern 5 is prepared on the basis of a pattern depicted on the resist film. A small dose of beams is used to depict the pattern according to FIB or scanning, which reduces the time necessary for pattern depiction. Further, the pattern depiction is performed by one exposure process in a short period of time. Thus, the stencil mask can be manufactured in a reduced period of time.

25 Claims, 10 Drawing Sheets

PRIOR ART

PRIOR ART

STENCIL MASK FOR PHOTOCHEMICAL REACTION PROCESS AND METHOD OF MAKING THE SAME

BACKGROUND OF THE INVENTION

1. Field of the Invention

This invention relates to a stencil mask for use with a photochemical reaction process, and a method of making such a stencil mask, and more particularly to a stencil mask for selectively etching and depositing an object to be processed at particular surface areas thereof by applying a reactive gas and light beams thereto.

2. Description of the Prior Art

At present, a plasma-assisted reactive-ion etching (RIE) method has been in wide use to manufacture semiconductor devices. However, the more the semiconductor devices are integrated and miniaturized, the more extensively the operation of components thereon is affected by damage caused during the manufacturing process. In other words, the reactive-ion etching method is prone to a problem that it tends to damage semiconductor devices extensively during the etching process, which leads to reduced yields of semiconductor devices.

To overcome this problem, it is necessary to set low ion energy in the reactive-ion etching process. As reported in "Semiconductor News", page 31, Oct., 1988, reduction in the ion energy lowers the etching anisotropy, which makes it to difficult to form minute precise patterns.

The use of the photochemical reaction process, referred to in HYOMEN KAGAKU, Vol. 5, No.4, page 435, has drawn our attention with its application to the manufacture of semiconductors. The photochemical reaction process uses both a reactive gas (e.g., a gas containing halogen) and photons. Specifically, photons are irradiated onto certain areas of the object, e.g., a surface of a semiconductor substrate, and the reactive gas is applied to the irradiated areas so as to etch them selectively. A fluoride gas such as sulfur hexafluoride ($SF_6$) is used as the reactive gas. Photons enhance the etching process. In other words, since charged particles which are used in the reactive-ion etching are absent, the surface of the substrate will not be damaged.

Further, no intimate contact type photoresist mask is necessary in the photochemical reaction process although such a mask is indispensable in photoresist lithography. This process is advantageous since it can dispense with a photoresist mask forming process.

FIG. 25 of the accompanying drawings shows a cross-sectional view of a stencil mask for the photochemical reaction process. The stencil mask comprises a mask substrate 20, a window 21, a self-supportive film 22, a pattern 23, a rear reinforcement film 24, an intermediate film 25, and an absorber film 26.

The mask substrate 20 is made of silicon (Si) which has been in wide use in semiconductor technology due to its reliability.

The window 21 is formed in the mask substrate 20, and photons and reactive gas pass through the pattern 23 to the surface of an object to be processed.

The support film 22 is formed on the mask substrate 20 where the mask substrate 20 is in close contact with the object. The support film 22 enhances tension (internal stress) applied to the absorber film 26, thereby preventing the absorber film from being peeled off or loosened. The support film 22 is usually made of boron nitride (BN).

The rear reinforcement film 24 is formed on the rear surface of the mask substrate 20 so as to offset the internal stress generated by the support film 22, thereby keeping the mask substrate 20 from being bent. The rear reinforcement film 24 is made of boron nitride (BN) similarly to the support film 22.

The intermediate film 25 covers the surfaces of the support film 22 and the rear reinforcement film 24, and an exposed surface of the mask substrate 20. The intermediate film 25 enhances the adhering force between the support film 22 and the absorber film 26, and the adhering force between the rear reinforcement film 24 and the absorber film 26. The intermediate film 25 is made of chromium (Cr), for example.

The absorber film 26 covers the entire surface of the intermediate film 25, and absorbs or reflects photons which are incident outside the surface of the object. The absorber film 26 is made of gold (Au).

The pattern 23 includes a mask pattern made of the support film 22, and is covered by the intermediate film 25 and the absorber film 26. The pattern 23 is positioned on the front surface of the mask substrate 20 at a region corresponding to the window 21.

FIGS. 26 to FIG. 28 show processes for making the stencil mask for the photochemical reaction process of the prior art.

In a first step, the mask substrate 20 is covered with the self-supportive film 22 on the front surface thereof, and with the rear reinforcement film 24 on the rear surface thereof. Referring to FIG. 26, a part of the rear reinforcement film 24 is cut so as to form a part of the window 21.

In a second step, a through-hole is made by back-etching in the mask substrate 20 from the rear surface thereof, serving as the window 21, as shown in FIG. 27.

In a third step shown in FIG. 28, the pattern 23 is prepared on the self-supportive film 22 at the window region. Specifically, the mask pattern is depicted by an ion-milling process according to the focussed ion beam (FIB) technique.

In a fourth step, as shown in FIG. 25, the intermediate film 25 and the absorber film 26 are sequentially formed over all of the surfaces of the self-supportive film 22 and the rear reinforcement film 24 including the basic pattern.

The foregoing stencil mask is prone to the following problems.

First of all, the self-supportive film 22 is used so as to enhance the stress applied to the absorber film 26. In other words, the mask substrate 20 is covered with three films, i.e. the self-supportive film 22, the intermediate film 25, and the absorber film 26, which complicates the stencil mask structure. This complicated structure requires very complicated calculation of an amount of light transmission and diffraction, which would make it difficult to transfer minute precise patterns onto the object.

Secondly, the pattern 23 includes the basic pattern on the self-supportive film 22, and the intermediate film 25 and the absorber film 26 covering the basic pattern. Therefore, even if the basic pattern on the self-supportive film 22 is very precise, the presence of the intermediate film 25 and the absorber film 26 adversely affect the quality of the pattern 23.

Thirdly, the three films are formed on the mask substrate 20 as described above, which means an increase in the mask making process.

Finally, the basic pattern is directly depicted on the self-supportive film 22 by the focussed ion beam (FIB) process. Further, a great dose of focussed ion beams should be applied to depict the basic pattern on the absorber film 26. Scanning is also necessary in the focussed ion beam process, which means that it takes time to depict the basic pattern, i.e., a lot of time is necessary to manufacture the stencil mask.

SUMMARY OF THE INVENTION

The present invention is contemplated so as to overcome the foregoing problems of the prior art.

It is a first object of the invention to simplify a structure of the stencil mask so as to form precise patterns on an object to be processed.

A second object of the invention is to enhance the precision of the pattern.

It is a third object of the invention to reduce steps to make the stencil mask.

A final object of the invention is to shorten the time for a pattern-depicting process, and reduce the time for making the stencil mask.

According to a first aspect of the invention, there is provided a stencil mask comprising: a mask substrate having a window; an absorber film not only absorbing or reflecting photons but also being self-supportive; and a pattern depicted on the absorber film at a region corresponding to the window, whereby the mask stencil comes into close contact with an object to be processed so that the pattern is transferred onto particular areas of the object by photons irradiated through the window.

In this arrangement, the absorber film not only absorbs or reflects photons but is also self-supportive. The absorber film suppresses its internal stress so as to be flat on the surface thereof. When it has a large internal stress, the absorber film tends to be peeled off from the mask substrate. Conversely, the absorber film having a much smaller internal stress may become loose. The light absorbing or reflecting function of the absorber film can dispense with the presence of another film having this supportive function. Therefore, the pattern can be prepared very precisely since there is no factor lowering the quality of the pattern. For instance, the pattern can be made precise in wiring widths and spaces between wiring.

When it has the self-supportive function, the absorber film tends to become somewhat thick. In other words, the number of films on the mask substrate can be reduced compared when there is another self-supportive film present. This means that the mask stencil has a simplified structure.

In a second aspect of the invention, the mask substrate includes a rear reinforcement film on the rear surface thereof to offset internal stress in the absorber film.

The presence of the rear reinforcement film keeps the mask substrate from being bent, and maintains the absorber film flat. The pattern can be precisely depicted on the flat absorber film. Further, the rear reinforcement film enhances the mechanical strength of the mask substrate, which makes the stencil mask usable for a long period of time.

According to a third aspect of the invention, an intermediate film is positioned between the front surface of the mask substrate and the absorber film, and has an adhering force with the substrate and an adhering force with the absorber film which are larger than the adhering force between the mask substrate and the absorber film.

The intermediate film increases the adhering force between the mask substrate and the absorber film, so that the absorber film is kept from being peeled and loosened, because of the increased adhering force, and maintains its flatness, thereby raising the quality of the pattern thereon.

In a fourth aspect of the invention, an intermediate film is positioned between the rear surface of the mask substrate and a rear reinforcement film, and has an adhering force with the mask substrate and an adhering force with the rear reinforcement film which are larger than the adhering force between the mask substrate and the rear reinforcement film. Thus, the mask substrate has the rear reinforcement film on the rear surface thereof to offset the internal stress of the absorber film.

According to a fifth aspect of the invention, the mask substrate is made of a material which is not damaged by a gas or photons used in the photochemical reaction process.

In a sixth aspect, the mask substrate is made of a material which is not corroded by a reactive gas, including halogen.

The absorber film is made of a material which is not damaged by a reactive gas or photons according to a seventh aspect of the invention.

In an eighth aspect, the rear reinforcement film is made of a material which is not damaged by a reactive gas or photons.

In a ninth aspect, the intermediate film is made of a material which is not damaged by a reactive gas or photons.

According to a tenth aspect, the mask substrate is made of silicon (Si), gallium arsenide (GaAs), aluminum (Al) or an alloy of nickel (Ni).

In an eleventh aspect, the absorber film is made of gold (Au), tungsten (W), tantalum (Ta), tungsten oxide, tantalum oxide, tungsten nitride, tantalum nitride, tungsten carbide, tantalum carbide, tungsten boride, or tantalum boride.

In an twelfth aspect, there is provided the stencil mask of the third or fourth aspect, wherein the intermediate film is made of chromium (Cr), nickel (Ni) or titanium (Ti).

According to a thirteenth aspect, there is provided a method of making a stencil mask for a photochemical reaction process, comprising: a) forming an absorber film on a surface of a mask substrate and depicting a pattern on the absorber film at a window region thereof, wherein the absorber film not only absorbs or reflects photons but is also self-supportive; and b) making a window in the mask substrate from the rear surface thereof at a position corresponding to the window region on the absorber film.

In a fourteenth aspect, the step a) includes: forming an absorber film on one surface of the mask substrate; and patterning the absorber film at the area corresponding to the window region by lithography and etching.

In a fifteenth aspect, the step a) includes: forming a resist film on the other surface of the mask substrate at an area outside the first absorber film and the pattern; forming a second absorber film on the other entire surface of the mask substrate including the first absorber film, the pattern and resist film by means of vacuum evaporation or sputtering; and selectively removing the resist film and entirely removing the second absorber film from the remaining resist film.

According to a final aspect, the method further includes: forming a rear reinforcement film on the mask substrate to offset internal stress of the absorber film, the rear reinforcement film having an opening at a window region; and etching the mask substrate from the rear surface thereof through the opening on the rear reinforcement film so as to form a window in the mask substrate.

BRIEF DESCRIPTION OF THE DRAWINGS

FIGS. 2 to 5 are simplified for brevity.

FIGS. 14 to 16 are simplified for brevity.

DETAILED DESCRIPTION OF THE PREFERRED EMBODIMENTS

Figure 1:
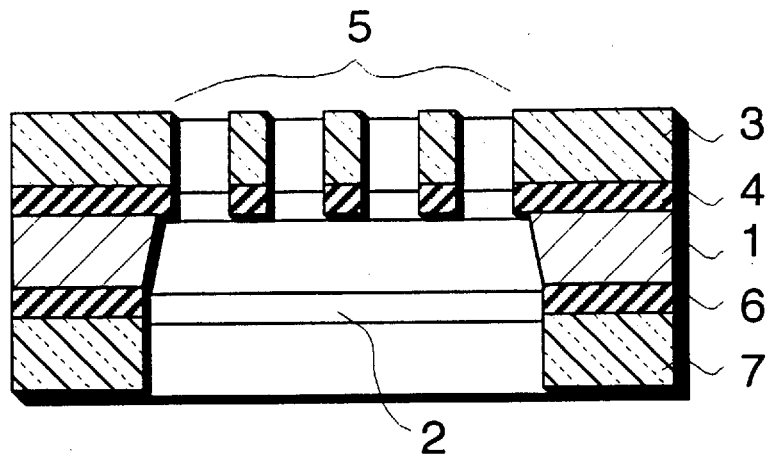
FIG. 1 is a diagrammatic cross-sectional view of a stencil mask for a photochemical reaction process, according to an embodiment of the invention.
Figure 2:
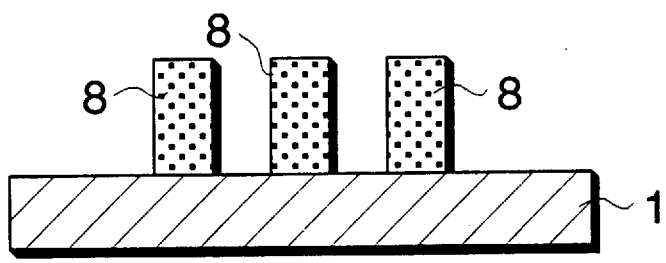
FIG. 2 to FIG. 6 are diagrammatic cross-sectional views showing steps of making the stencil mask in a first method including a pattern forming process by a lift-off technique.

Referring to FIG. 1, a stencil mask comprises a mask substrate 1, which has an absorber film 3 on the front surface thereof. Here, the term "front surface" represents a surface which is in close contact with a front surface of an object to be processed. The stencil mask further includes an intermediate film 4 formed between the mask substrate 1 and the absorber film 3.

The mask substrate 1 has a window 2 to pass photons. In this embodiment, the window 2 is positioned substantially at the center of the mask substrate 1. A pattern 5 is formed on the absorber film 3 and the intermediate film 4 at the positions corresponding to the window 2.

The mask substrate 1 has another intermediate film 6 formed on the rear surface thereof. A rear reinforcement film 7 is formed on the intermediate film 6.

The mask substrate 1 is made of silicon (Si), which has been extensively used for semiconductor devices because of its reliability, easy processing, and a reduced cost. Further, the technique to process a silicon substrate has been substantially completed. In addition to silicon, materials such as $SiO_2$, MgO and ITO (indium tin oxide) are usable as the mask substrate.

Materials such as GaAs, InP, Al, $Al_2O_3$, and Cu are also usable as the mask substrate. Compared with materials including silicon (Si), these materials are resistant to gases containing fluorine, abrasion caused by laser beams, and impairment caused by the photochemical reaction process. The use of such materials lengthens the effective life of the stencil mask and allows repeated use of the stencil mask.

The mask substrate 1 may be made of materials such as Ni, NiO, FeO, $Fe_2O_3$, $Fe_3O_4$, Cr, CrO, or an alloy of nickel (Ni) (for instance, SUS314 and SUS304: trade names). These materials are also resistant to etching with a gas including halogen, abrasion by the laser beams, and impairment by the photochemical reaction process.

Materials which are susceptible to the photochemical reaction process may be used as the stencil mask so long as the precision of the pattern 5 and the strength of the stencil mask are in acceptable ranges.

The absorber film 3 not only absorbs or reflects photons but also supports itself by its own internal stress so as to be flat. When it has a large internal stress, the absorber film 3 tends to peel off from the mask substrate 1. Conversely, when the internal stress is too small, the absorber film 3 may become loose.

To be self-supportive, the absorber film 3 has to satisfy a requirement that a ratio ($t/\sqrt{S}$) should be $1\times10^{-4}$ or more, where t represents a thickness of the absorber film 3, and S represents the area of the window 2. The ratio denotes a thickness of the absorber film 3 which is necessary per unit length of each side of the window 2. The foregoing ratio is applicable to the absorber film 3 which is made of either SiN or SiC. This fact can be known from the following documents.

1. C.C.G, Visser et al., Micro Circuit Engineering 87 (North-Holland), p 299, and
2. A. Madouri et al., Micro Circuit Engineering 87 (North-Holland), p 241.

The absorber film 3 should have a tensile strength itself so as to be self-supportive. For instance, when a silicon (Si) substrate having a thickness of 400 μm is used as the mask substrate 1, the absorber films should have an internal stress of $10^8$ $dyne/cm^2$ or more.

When the absorber film 3 is self-supportive, it is possible to reduce the number of films formed on the mask substrate 1 compared with the mask substrate of the prior art. In other words, the stencil mask can be simplified in its structure.

The absorber film 3 is made of gold (Au). Further, the absorber film 3 may be made of materials such as metals, alloys, metal carbide, metal nitride, metal oxide, metal boride, metal silicide, materials for semiconductors, and organic materials. The metals are tantalum (Ta), tungsten (W), rhenium (Re), platinum (Pt), molybdenum (Mo), titanium (Ti), and aluminum (Al).

The alloys are tungsten-rhenium (W-Re), and platinum-palladium (Pt-Pd).

The metal carbide materials are AuC, TaC, WC, $W_2C$ and TiC. The metal nitride materials are TaN, $Ta_3N_5$, and TiN.

The metal oxide materials are $Ta_2O_5$, $WO_3$, $ReO_2$, $TiO_2$, $MoO_2$, and $Al_2O_3$.

The metal boride materials are $TaB_4$, WB, $W_2B$ and TiB.

The metal silicide materials are $WSi_2$ and $TiSi_2$.

The materials for semiconductors are Si, Ge, SiC, $Si_3N_4$, SiN, $SiO_2$, C, BN, BNC, GaAs and InP.

The organic material is polyimid resin.

The absorber film 3 is made of a film which is resistant to corrosion caused by a reactive gas such as a halogen gas containing at least fluoride or a halogen-mixed gas, abrasion due to laser beams, and damage caused during the photochemical reaction process. When the absorber film 3 is made of the foregoing materials, the stencil mask can have a longer effective life and can be used repeatedly. Further, metals having high fusing points tend to absorb photons with short wavelengths, so that they can make the absorber film 3 thinner. Film materials which are affected by the photochemical reaction process may also be used so long as the precision of the pattern 5 and the mechanical strength of the stencil mask are within acceptable ranges.

The rear reinforcement film 7 offsets the stress in the absorber film 3, thereby preventing the mask substrate 1 from being bent. For this purpose, it is preferable that the rear reinforcement film 7 and the absorber film 3 are made of the same material and have the same thickness. When the absorber film 3 is made of tungsten (W) having a large stress, the rear reinforcement film 7 is indispensable. However, the absorber film 3 has a relatively small stress and the bending of the mask substrate 1 is within an acceptable range, so the rear reinforcement film 7 is not always required.

When the rear reinforcement film 7 effectively reduces the bending of the mask substrate 1, the absorber film 3 is flattened on its surface. The pattern 5 on such a flat absorber film 3 can be made more precise. Further, the rear reinforcement film 7 can mechanically reinforce the mask substrate 1.

The intermediate film 4 serves to enhance an adhering force (close contact) between the absorber film 3 and the front surface of the mask substrate 1. Similarly, the intermediate film 6 functions to enhance an adhering force between the rear reinforcement film 7 and the rear surface of the mask substrate 1.

The intermediate films 4 and 6 are made of a material such as a chromium (Cr) film, and may be made of Ni, Ti, In, silicon oxide, silicon nitride, $InO_2$, $Al_2O_3$, or epoxy resin. These intermediate films 4 and 6 are resistant to corrosion caused by a reactive gas such as the halogen gas containing at least fluoride or the halogen-mixed gas, abrasion due to laser beams, and damage caused during the photochemical reaction process. Therefore, the stencil mask can lengthen its effective life and can be used repeatedly. The materials which are affected by the photochemical reaction process may also be used so long as the precision of the pattern 5 and the mechanical strength of the stencil mask are within acceptable ranges. Further, when the absorber film 3 and the mask substrate 1 have sufficient adhering force therebetween, the intermediate film 4 is not always necessary. This also holds true for the intermediate film 6.

The intermediate film 4 enhances the adhering force between the mask substrate 1 and the absorber film 3, and keeps the absorber film 3 tight and much flatter. In other words, the pattern 5 can be more precisely depicted on the absorber film 3.

The pattern 5 is depicted on both of the absorber film 3 and the intermediate film 4 at the window region.

When the intermediate film 4 is dispensed with, the pattern 5 is depicted only on the absorber film 3. In such a case, no additional film is formed on the sides of the absorber film 3 since the pattern 5 is depicted only on the single layer of the absorber film.

Methods of making stencil masks will be described hereinafter.

First Stencil Mask Making Method

Referring to FIGS. 2 to 6, this method comprises forming the absorber film 3 and the pattern 5 by the lift-off process, and making the window 2 by back etching.

In a first step, resist masks 8 are formed on the surface of the mask substrate 1 so as to perform the lift-off process. A silicon (Si) substrate of 400 $\mu$m to 600 $\mu$m is used as the mask substrate 1. The resist mask 8 is formed on the surface of the mask substrate 1 at areas where no intermediate film 4 and the absorber film 3 are present.

The resist mask 8 is formed on the mask substrate 1 to a thickness of about 600 nm by spin-coating, exposed and developed, thereby obtaining a desired pattern. The resist mask 8 may be an electron resist, e.g. MICROPOSIT E-BEAM RESIST SAL601-ER7 (trade name), manufactured by SHIPLEY. The electron resist mask 8 is patterned by a reduced dose of focussed ion beams (FIB) or electron beams (EB) compared with the case where the absorber film 3 and the conventional self-supportive film 22 are directly patterned with focussed ion beams (FIB). Thus, the patterning time can be reduced drastically. For instance, the electron resist having a thickness of 600 nm can be patterned in a time of one thousandth or less compared with a BN film having the same thickness. The resist mask 8 is patterned by i-Line beams. Since i-Line beams can expose the resist with more effective energy than FIB, a patterning period can be further shortened when scanning is concurrently performed. Further, since the i-Line beams can provide sufficient energy even when they are optically broadened, patterning can be performed simultaneously without scanning. In this case, the resist mask 8 can be patterned with lines and spaces whose size is in the order of sub-microns. Naturally, ordinary photolithography is applicable to the patterning. The entire pattern can be depicted at one time.

The resist mask 8 is developed by a developer such as MICROPOSIT developer (trade name), MF622, manufactured by SHIPLEY.

Figure 3:
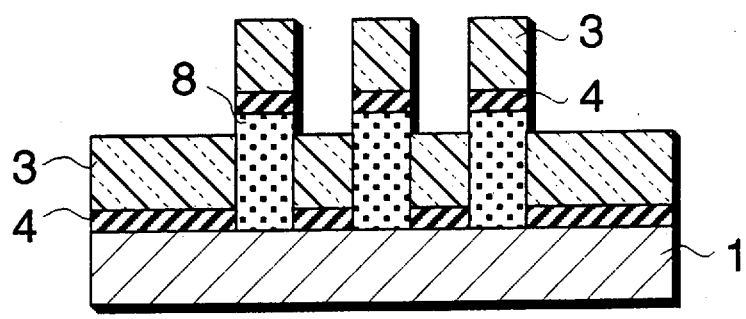

In a second step, the intermediate film 4 is formed on the mask substrate 1 including the resist mask 8. Then, the absorber film 3 is formed on the intermediate film 4 as shown in FIG. 3. The intermediate film 4 is a chromium (Cr) film which is made by vacuum evaporation. A vacuum evaporation rate is set to approximately 0.2 nm/s. The Cr film is approximately 30 nm thick.

The absorber film 3 is an Au film, for example, which is vacuum-evaporated at a rate of approximately 1.2 nm/s. When it is about 300 nm to 450 nm thick, the Au absorber film 3 absorbs or reflects photons, and is self-supportive. However, when it is about 150 nm thick, the absorber film 3 can absorb or reflect photons, but is not strong enough to be self-supporting. Therefore, the absorber film 3 should be two or three times thicker than an ordinary thickness. An appropriate material is selected for the absorber film 3 depending upon a wavelength of photons used for the photochemical reaction process.

Figure 4:
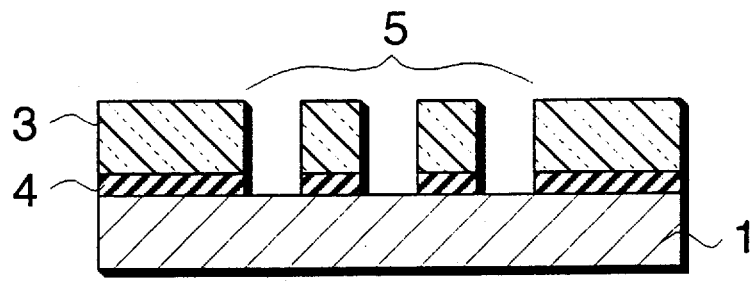

Referring to FIG. 4 showing a third step, the resist mask 8 is selectively removed, and unnecessary regions of the intermediate film 4 and the absorber film 3 are also removed, so that the pattern 5 is formed on the mask substrate 1. The absorber film 3, intermediate film 4 and pattern 5 are formed by the lift-off process. The resist mask 8 is removed by a mixture of sulfide acid ($H_2SO_4$) and hydrogen peroxide ($H_2O_2$), for example, and ultrasonic waves.

Figure 5:
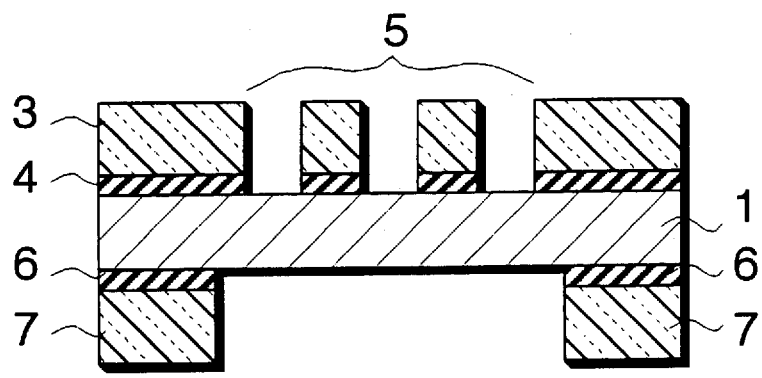
Figure 6:
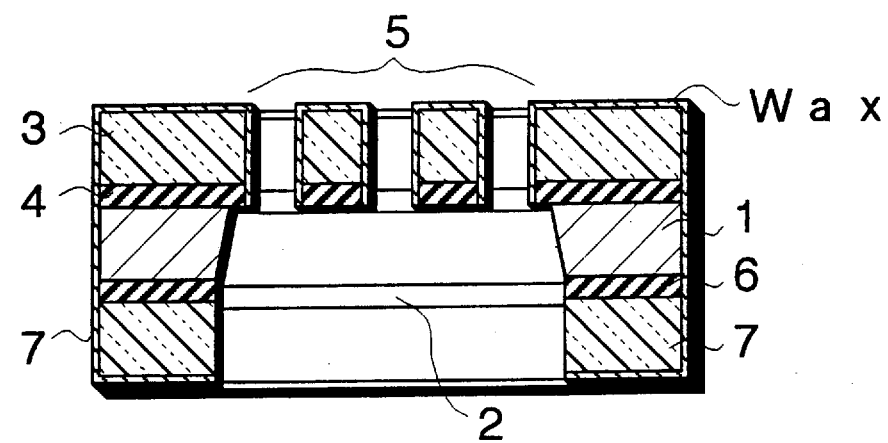
Figure 7:
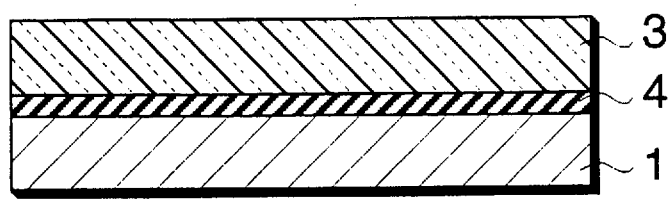
FIG. 7 to FIG. 10 are diagrammatic cross-sectional views showing steps of making the stencil mask in a second method including a pattern forming process by etching, being simplified for brevity.

Referring to FIG. 5 showing a fourth step, the intermediate film 6 and the rear reinforcement film 7 having openings at the window region corresponding to the window 2 are formed on the rear surface of the mask substrate 1. The openings are substantially at the center of the intermediate film 6 and the rear reinforcement film 7, and are a rectangle whose sides are several millimeters at maximum.

The intermediate film 6 is directly formed on the rear surface of the mask substrate 1, and is made of chromium (Cr) similarly to the foregoing intermediate film 4. The intermediate film 6 is formed by vacuum evaporation at a rate of approximately 0.2 nm/s, and is about 30 nm thick.

The rear reinforcement film 7 is formed on the intermediate film 6, and made of gold (Au) similarly to the absorber film 3 so as to minimize bending of the mask substrate 1. The Au rear reinforcement film 6 is prepared by vacuum evaporation at a rate of 1.2 nm/s, and is as thick as the absorber film 3, i.e. about 300 nm to 450 nm.

The intermediate film 6, the rear reinforcement film 7 and their openings are made by the lift-off process, for example. Specifically, the resist mask 8 is formed on the rear surface of the mask substrate 1 at the window region corresponding to the window 2. Next, the intermediate film 6 and rear reinforcement film 7 are formed on the rear surface of the mask substrate in succession. Finally, the resist mask 8 is selectively removed, and the unnecessary regions of the intermediate film 6 and rear reinforcement film 7 are also removed. The photolithograpy and etching are performed for the foregoing window-making procedure.

In a fifth step, the mask substrate 1 is etched from the rear to the front surface thereof so as to remove a part therefrom. Thus, the window 2 is formed by back-etching.

The exposed regions such as the absorber film 3 except for the window region (corresponding to the window 2) are covered with protective wax (see FIG. 6), which protects the mask substrate 1 against the back-etching, and the exposed portion of the absorber film 3 and rear reinforcement film 7 during the back-etching. In this embodiment, the protective wax is made of a material containing tar, and is resistant to alkalized solutions. A solvent such as toluene or xylene is used to apply or remove the protective wax. Usually, it is not necessary to remove the protective wax. However, when it is inconvenient to leave the protective wax during the use of the stencil mask, the protective wax will be removed by the foregoing solvent after making the window 2. The part of the mask substrate 1 which is not covered by the protective wax is removed during the back-etching, thereby forming the window 2. Since the mask substrate 1 is made of silicon (Si) in this embodiment, the back-etching is performed by using a KOH aqueous solution which is 20 wt % and 90° C. to 100° C. hot (2.2 $\mu$m/min).

When the mask substrate 1 is made of GaAs, it is backetched by an aqueous solution of $H_2SO_4$, $H_2O_2$ and $H_2O$ (=1:1:1) so as to make the window 2.

When it is made of Al or SUS, the mask substrate 1 is punched, drilled, or chemically etched by an acidic fluoric aqueous solution so as to make the window 2.

Further, in the foregoing first step, it is possible to form the absorber film 3 and depict the pattern 5 by the lift-off process after formation of the intermediate film 4 on the mask substrate 1. In other words, the intermediate film 4 is formed on the mask substrate 1 first, and then the resist mask 8 is placed on the intermediate film 4. Thereafter, the absorber film 3 is covered all over the intermediate film 4 as well as the resist mask 8. Finally, the resist mask 8 is removed together with the unnecessary portion of the absorber film 3. Thus, the absorber film 3 and the pattern 5 are made as desired. The intermediate film 4 which is positioned under the pattern 5 is left after the foregoing process. Unless the intermediate film 4 is made of a material absorbing or reflecting photons, photons can reach the surface of the object to be processed. In such a case, it is not necessary to remove such an intermediate film 4.

This first method can reduce the number of films placed on one surface of the mask substrate 1. This is because the absorber film 3 present on the mask substrate 1 absorbs or reflects photons used in the photochemical reaction process but is also self-supportive. This means that the stencil mask can be made in a reduced number of steps. Further, the window 2 is made in the mask substrate 1 after the pattern 5 is depicted on the absorber film 3 beforehand. When used as an etching mask to make the window 2, the rear reinforcement film 7 is patterned prior to making of the window 2. In such a case, either the absorber film 3 or the pattern 5 may be contaminated. To prevent such contamination, the absorber film 3 is formed and the pattern 5 is formed before such contamination takes place in the foregoing method. Therefore, the pattern 5 can be prepared precisely.

In the first method, the absorber film 3 and the pattern 5 are formed and depicted, respectively, by the lithography and the lift-off technique including etching. In the lithography, the pattern 5 is exposed once to be depicted on the resist mask 8. Therefore, neither an FIB technique nor beam scanning are utilized during the pattern depiction. This means that the pattern can be depicted in a short period of time, and that the stencil mask can be manufactured very quickly. Further, even when the FIB technique is used, the pattern can be depicted on the resist mask 8 with a small dose of beams compared with direct patterning on a metal film, a boron nitride film, and so on. This also means that the patterning can be carried out in a shortened period of time, which leads to reduced time to manufacture the stencil mask. The lift-off technique enables the pattern to be depicted extensively minutely compared with the ion milling technique using FIB. When the lift-off technique is used, the absorber film 3 may be formed by another deposition technique such as sputtering.

Second Stencil Mask Making Method

A second method of making a stencil mask will be described with reference to FIGS. 7 to 10. This method comprises a first step of depicting a pattern without the lift-off technique and forming the absorber film 3 and the pattern 5 by etching, and a second step of forming the window 2 by back etching.

In the first step, the intermediate film 4 and the absorber film 3 are formed on the mask substrate 1 in succession. The intermediate film 4 is formed under conditions similar to the conditions in the first method. The absorber film 3 is made of a material such as tungsten (W), which is suitable for anisotropic etching of pattern 5 in a later stage.

Figure 8:
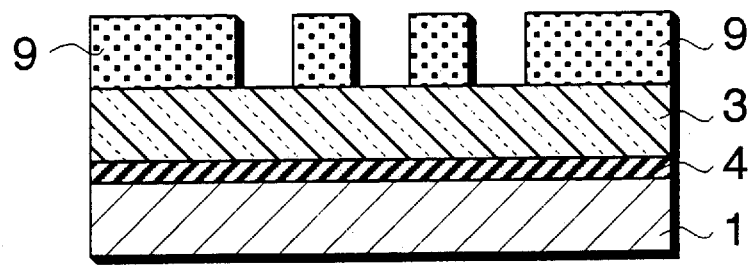

Referring to FIG. 8, an etching mask 9 is formed on the absorber film 3 in the second step. A photoresist mask or a multi-layered mask such as a photoresist mask on an $SiO_2$ film is used as the etching mask 9. The photoresist mask is applied by spin-coating on the absorber film 3, and is then patterned by FIB similarly to the first method. The patterned photoresist mask is then developed. Since the patterning is performed on the photoresist mask, a small dose of beams is sufficient. Therefore, the patterning can be carried out in a short period of time. As described in the first method, the patterning can be carried out by using i-Line beams and so on.

Figure 9:
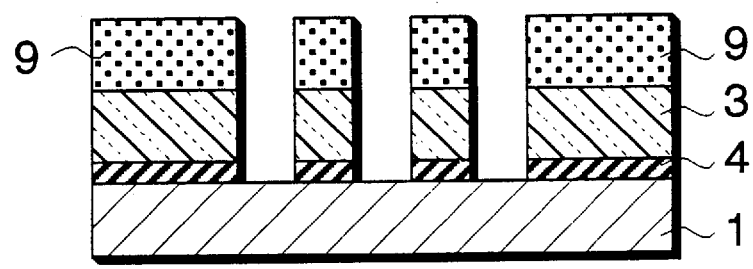

In the third step, the absorber film 3 and the intermediate film 4 are etched and removed by using the etching mask 9, as shown in FIG. 9. Thus, the pattern 5 is prepared. The anisotropic etching such as RIE having the directivity is applied in this step. After etching, the etching mask 9 is removed.

Figure 10:
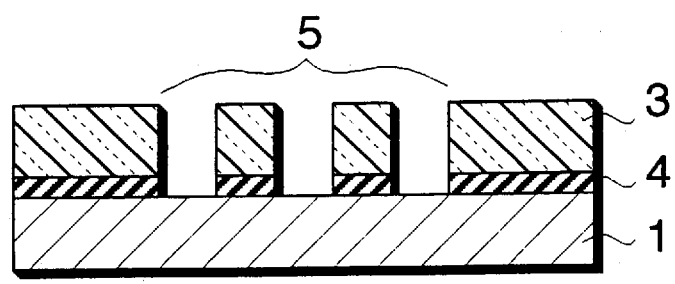
Figure 11:
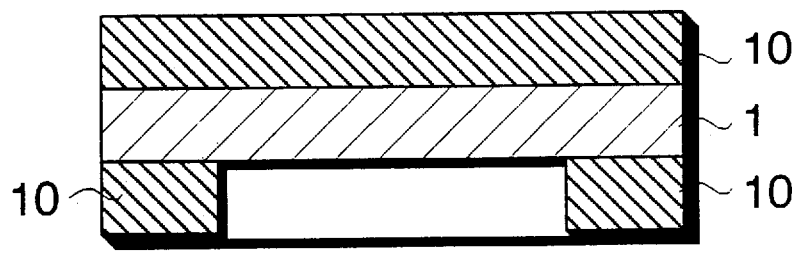
FIG. 11 to FIG. 18 are diagrammatic cross-sectional views showing steps of making the stencil mask in a third method.

The etching mask 9 is removed as shown in FIG. 10 in the fourth step.

During the fifth step, the intermediate film 6 and rear reinforcement film 7 are formed on the rear surface of the mask substrate 1 (not shown in FIG. 10), and the window 2 is made.

Third Stencil Mask Making Method

Referring to FIGS. 11 to 18, the stencil mask is made as described below according to a third method. This method comprises a first step of making the window 2 on the mask substrate 1, a second step of forming the absorber film 3 and depicting the pattern 5, and a third step of laminating the absorber film 3 on the front surface of the mask substrate 1.

In the first step, etching masks 10 are formed on the opposite surfaces of the mask substrate. At least one of the etching masks 10 has an opening at a position corresponding to the window 2. The etching masks 10 are made of gold (Au), for example.

Figure 12:
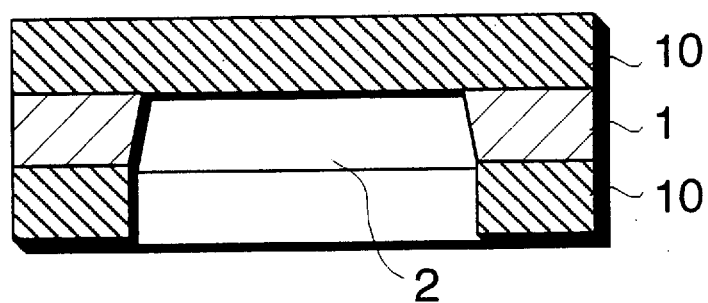

A part of the mask substrate 1 is removed to make the window 2 as shown in FIG. 12.

Figure 13:
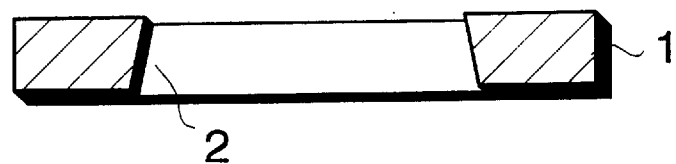

In the third step, the etching masks 10 are removed as shown in FIG. 13.

Figure 14:
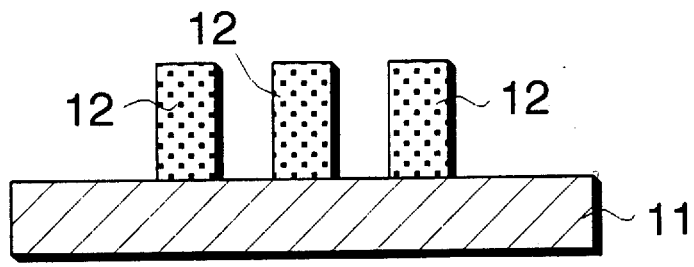
Figure 15:
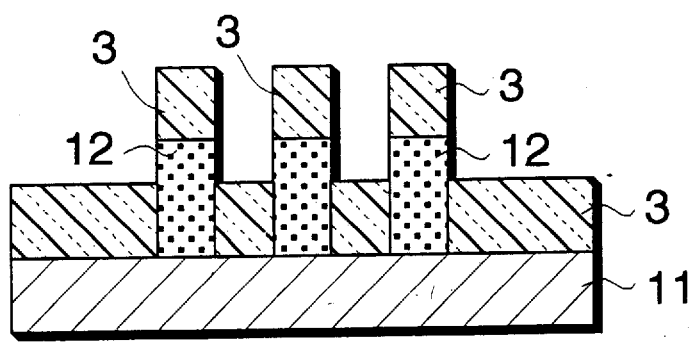
Figure 16:
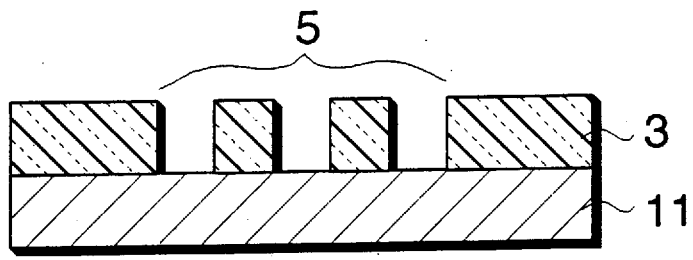

During the fourth step, a substrate 11 is prepared independently of the mask substrate 1. Similarly to the first step, the absorber film 3 is formed and the pattern 5 is depicted on the substrate 11 by the lift-off process. Referring to FIG. 14, first, the resist mask 12 is formed on the substrate 11. Next, the absorber film 3 is laid all over the substrate 11 and the resist mask 12 as shown in FIG. 15. The absorber film 3 is an $SiO_2$ film deposited by sputtering, for example. Thereafter, as shown in FIG. 16, the resist mask 12 is removed together with the unnecessary portions of the absorber film 3 on the resist mask 12.

Figure 17:
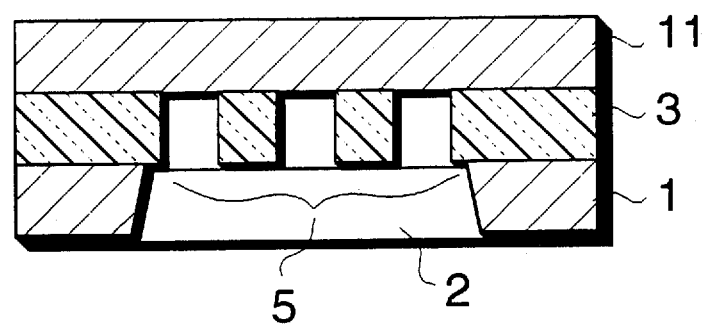

Referring to FIG. 17, the absorber film 3 on the substrate 11 is bonded on the mask substrate 1.

Figure 18:
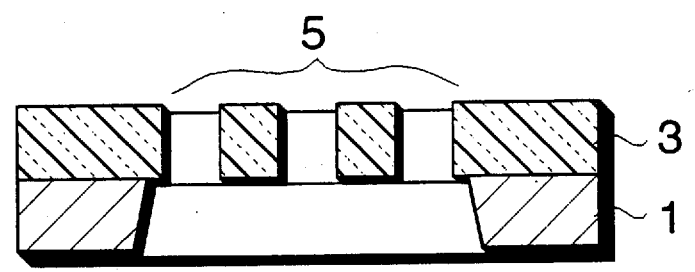

Finally, the substrate 11 is removed as shown in FIG. 18.

Fourth Method of Making a Stencil Mask

A fourth method of making the stencil mask will be described with reference to FIGS. 19 to 24. This method comprises a first step of making the window 2 on the mask substrate 1, a second step of laminating the absorber film 3 on the mask substrate 1, and a third step of depicting the pattern 5 on the absorber film 3.

Figure 19:
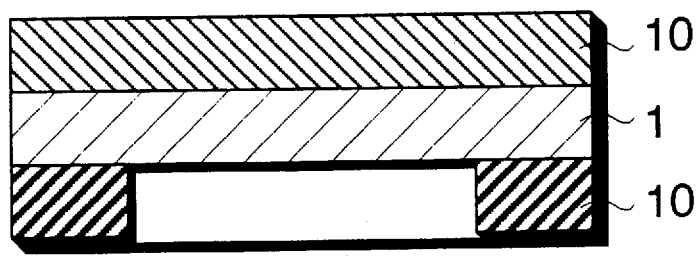
FIG. 19 to FIG. 24 are diagrammatic cross-sectional views showing steps of making the stencil mask in a fourth method.

In the first step, etching masks 10 are formed on the opposite surfaces of the mask substrate 1 as shown in FIG. 19. Specifically, the etching mask 10 on the front surface of the mask substrate 1 is made of boron nitride while the other etching mask 10 on the rear surface of the mask substrate 1 is made of Au, and has an opening.

Figure 20:
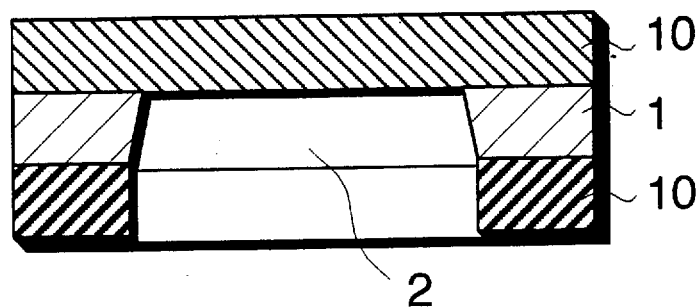

A part of the mask substrate 1 is removed by etching, thereby making the window 2 as shown in FIG. 20.

Figure 21:
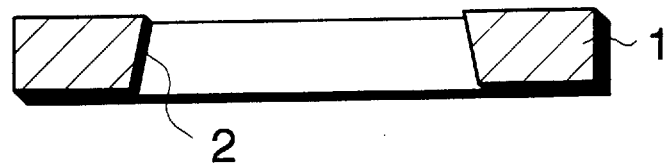

In the third step, the etching mask 10 is removed as shown in FIG. 21.

Figure 22:

Then, the absorber film 3 is prepared as shown in FIG. 22.

Figure 23:
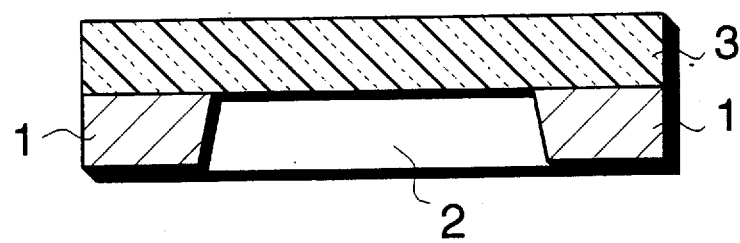
Figure 24:
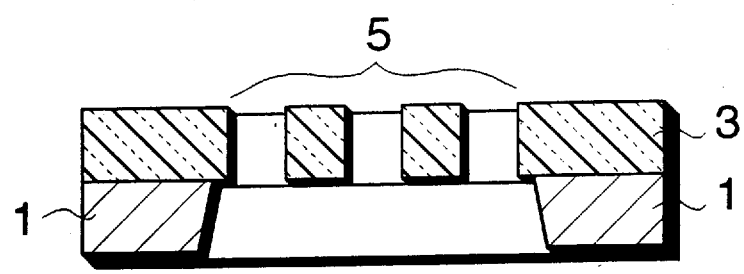
Figure 25:
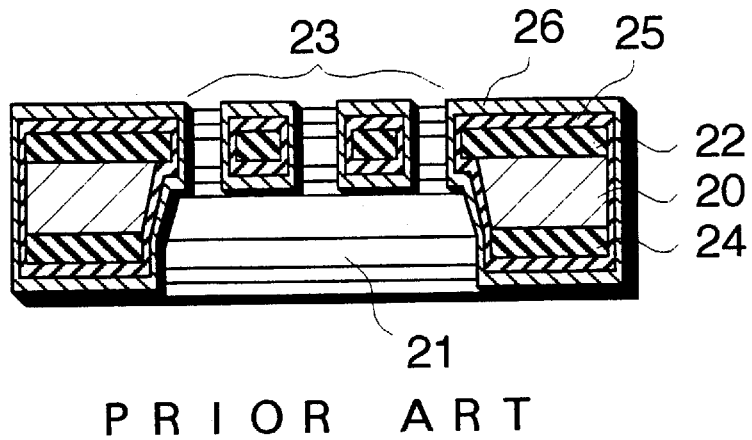
FIG. 25 is a diagrammatic cross-sectional view showing a stencil mask of the prior art.
Figure 26:
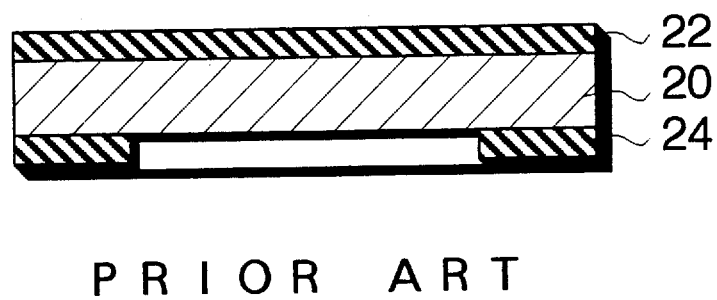
FIG. 26 to FIG. 28 are diagrammatic cross-sectional views showing steps of making the stencil mask of FIG. 25.
Figure 27:
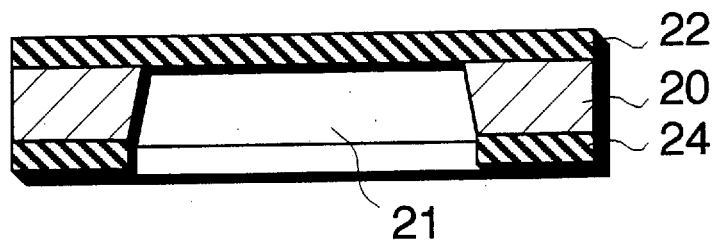
Figure 28:
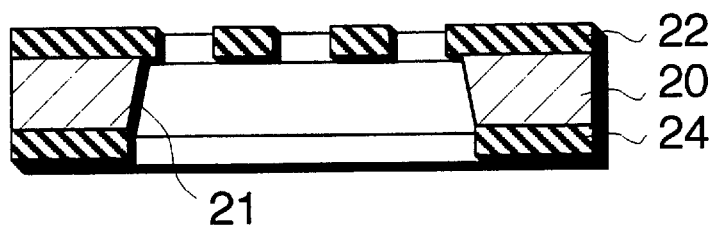

Referring to FIG. 23, the absorber film 3 is bonded onto the mask substrate 1.

In the fifth and final step, the pattern 5 is directly depicted on the absorber film 3 by using FIB. Further, the pattern 5 may be prepared by photolithography and etching.

According to the foregoing first and second methods, the window 2 is made after depicting the pattern 5 on the absorber film. Alternatively, it is possible to depict the pattern 5 after making the window 2. Further, the absorber film 3 may be first formed on the mask substrate, the window 2 may be made on the absorber film 3, and then the pattern 5 may be depicted on the absorber film.

The present invention offers the following advantages. First of all, the structure of the stencil mask can be simplified, and a precise minute pattern can be transferred onto the object to be processed. Further, calculation of light transmittivity and diffraction can be carried out in a simple manner. Secondly, the quality of the pattern can be improved. Thirdly, the stencil mask can be manufactured in a reduced number of steps. Fourthly, the pattern can be depicted in a short period of time, which leads to shortening of the stencil mask manufacturing process. Finally, the stencil mask is made so mechanically strong that it can be used for a long period of time.

What is claimed is:

1. A stencil mask for use in a photochemical reaction process, said stencil mask comprising:

a mask substrate having a window and a front surface and a rear surface;

an absorber film absorbing and reflecting photons, said absorber film having an internal stress so as to be self-supportive; and a pattern formed in the absorber film at a region corresponding to the window, wherein the stencil mask comes into close contact with an object to be processed so that the pattern is transferred onto particular areas of the object by photons irradiated through the window.

2. A stencil mask for use in a photochemical reaction process, said stencil mask comprising:

a mask substrate having a window and a front surface and a rear surface;

an absorber film absorbing and reflecting photons, the absorber film having an internal stress so as to be self-supportive;

a rear reinforcement film on the rear surface of said mask substrate to offset internal stress in the absorber film; and a pattern formed in the absorber film at a region corresponding to the window, wherein the stencil mask comes into close contact with an object to be processed so that the pattern is transferred onto particular areas of the object by photons irradiated through the window.

3. The stencil mask of claim 2, wherein an intermediate film is positioned between the mask substrate and the rear reinforcement film.

4. A stencil mask for use in a photochemical reaction process, said stencil mask comprising:

a mask substrate having a window and a front surface and a rear surface;

an absorber film absorbing and reflecting photons, the absorber film having an internal stress so as to be self-supportive;

an intermediate film positioned between the front surface of the mask substrate and the absorber film, the intermediate film having an adhering force with the mask substrate and an adhering force with the absorber film larger than an adhering force between the mask substrate and the absorber film; and a pattern formed in the absorber film at a region corresponding to the window, wherein the stencil mask comes into close contact with an object to be processed so that the pattern is transferred onto particular areas of the object by photons irradiated through the window.

5. The stencil mask of claim 4, including a rear reinforcement film on the rear surface of said mask substrate to offset internal stress in the absorber film.

6. The stencil mask of claim 5, wherein an intermediate film is positioned between the mask substrate and the rear reinforcement film.

7. The stencil mask of claim 1, 2, 3, 4, 5 or 6, wherein the mask substrate is made of a material not damaged by at least one of a reactive gas for use in said photochemical reaction process and photons used in the photochemical reaction process.

8. The stencil mask of claim 1, 2, 3, 4, 5 or 6, wherein the mask substrate is made of a material not corroded by a reactive gas including halogen.

9. The stencil mask of claim 1, 2, 3, 4, 5 or 6, wherein the absorber film is made of a material not damaged by at least one of a reactive gas for use in said photochemical reaction process and photons used in the photochemical reaction process.

10. The stencil mask of claim 1, 2, 3, 4, 5 or 6, wherein the absorber film is made of a material not corroded by a reactive gas including halogen.

11. The stencil mask of claim 2, 3, 5 or 6, wherein the rear reinforcement film is made of a material not damaged by at least one of a reactive gas for use in said photochemical reaction process and photons used in the photochemical reaction process.

12. The stencil mask of claim 3, 4, 5 or 6, wherein the intermediate film is made of a material not damaged by at least one of a reactive gas for use in said photochemical reaction process and photons used in the photochemical reaction process.

13. The stencil mask of claim 1, 2, 3, 4, 5 or 6, wherein the mask substrate is made of one of silicon (Si), gallium arsenide (GaAs), aluminum (Al) and an alloy of nickel (Ni).

14. The stencil mask of claim 1, 2, 3, 4, 5 or 6, wherein the absorber film is made of one of gold (Au), tungsten (W), tantalum (Ta), tungsten oxide, tantalum oxide, tungsten nitride, tantalum nitride, tungsten carbide, tantalum carbide, tungsten boride, and tantalum boride.

15. The stencil mask of claim 3, 4, 5 or 6, wherein the intermediate film is made of one of chromium (Cr), nickel (Ni), titanium (Ti), silicon oxide, and silicon nitride.

16. The stencil mask of claim 2, 5 or 6, wherein the rear reinforcement film is made of one of gold (Au), tungsten (W), tantalum (Ta), tungsten oxide, tantalum oxide, tungsten nitride, tantalum nitride, tungsten carbide, tantalum carbide, tungsten boride, and tantalum boride.

17. The stencil mask of claim 1, wherein at least a portion of said absorber film is provided on a region of said mask substrate outside of said window so as to increase said self-supportiveness of said absorber film.

18. The stencil mask of claim 1, wherein said absorber film is directly attached to said front surface of said mask substrate.

19. The stencil mask of claim 1, wherein said absorber film has an internal stress with a tensile strength so as to be self-supportive.

20. The stencil mask of claim 1, wherein a ratio $(t/S^{1/2})$ is at least $1 \times 10^{-4}$ wherein t is a thickness of said absorber film and S is an area of said window.

21. The stencil mask of claim 1, wherein said absorber film is a gold (Au) film having a thickness in a range of about 300 nm to about 450 nm.

22. The stencil mask of claim 1, wherein said absorber film has an internal stress so that a surface of said absorber film is substantially flat.

23. The stencil mask of claim 1, wherein said absorber film is formed having a non-zero internal stress by being formed without an annealing reducing said non-zero internal stress to substantially zero.

24. A stencil mask for use in a photochemical reaction process, said stencil mask comprising:
   a mask substrate having a window and a front surface and a rear surface;
   an absorber film absorbing and reflecting photons and having an internal stress with a tensile strength so as to be self-supportive so that a surface of said absorber film is substantially flat; and
   a pattern formed on the absorber film at a region corresponding to the window, wherein the stencil mask comes into close contact with an object to be processed so that the pattern is transferred onto particular areas of the object by photons irradiated through the window.

25. A stencil mask for use in a photochemical reaction process, said stencil mask comprising:
   a mask substrate having a window and a front surface and a rear surface;
   an absorber film absorbing and reflecting photon, the absorber film having an internal stress so as to be self-supportive;
   a pattern formed in the absorber film at a region corresponding to the window; and
   an intermediate film formed between said absorber film and said mask substrate, a pattern being formed in said intermediate film that is substantially identical to said pattern formed in said absorber film at said region corresponding to said windows,
   wherein the stencil mask comes into close contact with an object to be processed so that the pattern is transferred onto particular areas of the object by photons irradiated through the window.

* * * * *